United States Patent
Koo et al.

(10) Patent No.: US 10,090,239 B2
(45) Date of Patent: Oct. 2, 2018

(54) METAL-INSULATOR-METAL ON-DIE CAPACITOR WITH PARTIAL VIAS

(71) Applicant: INTEL CORPORATION, Santa Clara, CA (US)

(72) Inventors: Jayong Koo, Folsom, CA (US); Suzanne L. Huh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 14/411,384

(22) PCT Filed: Jun. 26, 2013

(86) PCT No.: PCT/US2013/047944
§ 371 (c)(1),
(2) Date: Dec. 24, 2014

(87) PCT Pub. No.: WO2014/209302
PCT Pub. Date: Dec. 31, 2014

(65) Prior Publication Data
US 2016/0155698 A1   Jun. 2, 2016

(51) Int. Cl.
*H01L 23/522* (2006.01)
*H01L 49/02* (2006.01)
(Continued)

(52) U.S. Cl.
CPC ........ *H01L 23/5223* (2013.01); *H01L 21/288* (2013.01); *H01L 21/76802* (2013.01);
(Continued)

(58) Field of Classification Search
CPC . H01L 28/90; H01L 23/5223; H01L 23/5226; H01L 23/5286; H01L 27/0629
See application file for complete search history.

(56) References Cited

U.S. PATENT DOCUMENTS 5,834,992 A * 11/1998 Kato .................. H03H 5/02
                                                      333/185
5,945,892 A *  8/1999 Kato .................. H03H 7/0115
                                                      333/185
(Continued)

FOREIGN PATENT DOCUMENTS

CN   101180727    5/2008
CN   101315914   12/2008
(Continued)

OTHER PUBLICATIONS

Office Action from Counterpart KR Patent Application No. 2014-0077902, dated Aug. 17, 2015, 9 pages.
(Continued)

*Primary Examiner* — Bilkis Jahan
*Assistant Examiner* — Victor Barzykin
(74) *Attorney, Agent, or Firm* — Schwabe, Williamson & Wyatt P.C.

(57) ABSTRACT

A Metal-Insulator-Metal on-die capacitor is described with partial vias. In one example, first and second power grid layers are formed in a semiconductor die. The power grid layers have power rails. First and second metal plates are formed in metal layers of the die between the power grid layers. Full vias extend from a power rail of the first polarity of the first power grid layer to a first side of the second metal plate and from a second side of the second metal plate opposite the first side of the metal plate to a power rail of the first polarity of the second power grid layer. Partial vias extend from the power rail of the first polarity of the second power grid layer and end at the second side of the second metal plate.

20 Claims, 5 Drawing Sheets

(51) Int. Cl.
  *H01L 21/288* (2006.01)
  *H01L 21/768* (2006.01)
  *H01L 23/528* (2006.01)
  *H01L 23/00* (2006.01)
  *H01L 27/06* (2006.01)

(52) U.S. Cl.
  CPC .... *H01L 21/76879* (2013.01); *H01L 23/5226* (2013.01); *H01L 23/5286* (2013.01); *H01L 24/17* (2013.01); *H01L 27/0629* (2013.01); *H01L 28/90* (2013.01); *H01L 2224/16055* (2013.01); *H01L 2224/16057* (2013.01); *H01L 2224/16225* (2013.01); *H01L 2924/0002* (2013.01)

(56) References Cited

U.S. PATENT DOCUMENTS

| | | | |
|---|---|---|---|
| 6,191,479 B1* | 2/2001 | Herrell | H01L 23/5223 257/532 |
| 6,624,040 B1 | 9/2003 | Ng et al. | |
| 6,724,611 B1* | 4/2004 | Mosley | H01G 4/228 257/E27.116 |
| 6,737,728 B1* | 5/2004 | Block | H01L 23/5223 257/296 |
| 7,696,442 B2* | 4/2010 | Muramatsu | H05K 1/0231 174/260 |
| 2003/0080400 A1 | 5/2003 | Okamoto et al. | |
| 2008/0149369 A1 | 6/2008 | Kawamura et al. | |
| 2008/0296697 A1 | 12/2008 | Hsu | |
| 2009/0085201 A1* | 4/2009 | Mathew | H01L 25/0652 257/734 |
| 2011/0266683 A1 | 11/2011 | Feng | |
| 2012/0190164 A1 | 7/2012 | Coolbaugh et al. | |
| 2015/0214150 A1* | 7/2015 | Chang | H01L 23/5256 257/529 |

FOREIGN PATENT DOCUMENTS

| | | |
|---|---|---|
| JP | 2000058581 | 2/2000 |
| JP | 2003-133507 | 5/2003 |
| KR | 10-2004-0004809 | 1/2004 |
| WO | WO2003034487 | 4/2003 |

OTHER PUBLICATIONS

PCT International Search Report for PCT Counterpart Application No. PCT/US2013/047944, 5 pgs., (dated Mar. 25, 2014).

PCT Written Opinion of the International Searching Authority for PCT Counterpart Application No. PCT/US2013/047944, 4 pgs., (dated Mar. 25, 2014).

* cited by examiner

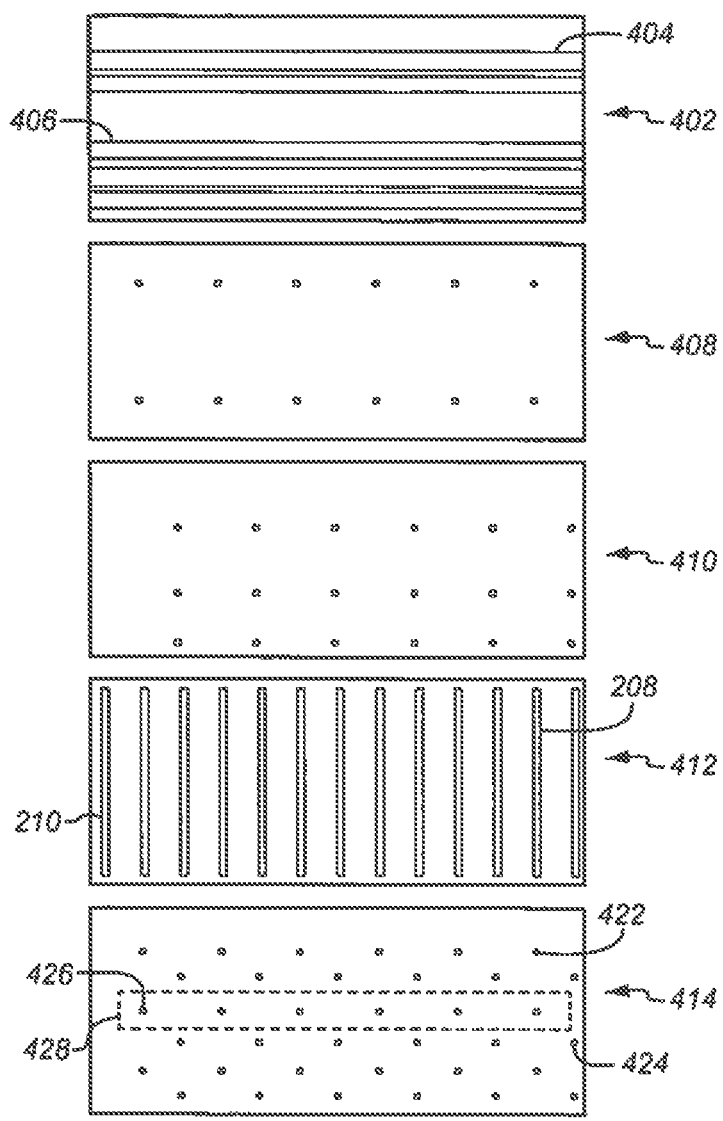

US 10,090,239 B2

METAL-INSULATOR-METAL ON-DIE CAPACITOR WITH PARTIAL VIAS

CROSS-REFERENCE TO RELATED APPLICATION

This patent application is a U.S. National Phase Application under 35 U.S.C. § 371 of International Application No. PCT/US2013/047944, filed Jun. 16, 2013, entitled "METAL-INSULATOR-METAL ON-DIE CAPACITOR WITH PARTIAL VIAS", the priority of which is hereby claimed.

FIELD

The present disclosure relates to the field of in-die capacitors and in particular to electrical connections for such capacitors.

BACKGROUND

Semiconductor dies include a power grid layer in the die that receives external power and spreads the power out to the various circuitries in one or more routings and circuitry layers of the die. The power supplied by the power grid is subject to a variety of different sources of noise that can disrupt normal operation of the circuitry. The noise may be in the form of voltage and current variations as well as in the form of additional signals. Since clocking type activities in the digital circuitry cause a majority of the noise, the noise can be filtered by capacitors in parallel with the power supply lines.

If the supply noise is higher than desired, then on-die decoupling capacitors are fabricated within the layers of the die. A metal-insulator-metal (MiM) capacitor is one example of an on-die decoupling capacitor that is used because it is embedded in the metal layers of the die and does not require additional die area.

A MiM capacitor requires a number of through vias. A through via connects the MiM plates to the adjacent grid layers on either side of the plates, i.e. to the upper layer and to the lower layer. The through via serves as a current path between the MiM and the rest of the power grid. This or any other type of vertical connection can make the connections within the die wherever the routing for these upper and lower layers overlap. The through vias like any other connecting vias are designed into the die uniquely for each die topology.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4A is a top elevation diagram of multiple layers of a MiM capacitor according to an embodiment of the invention.

DETAILED DESCRIPTION

Figure 1:
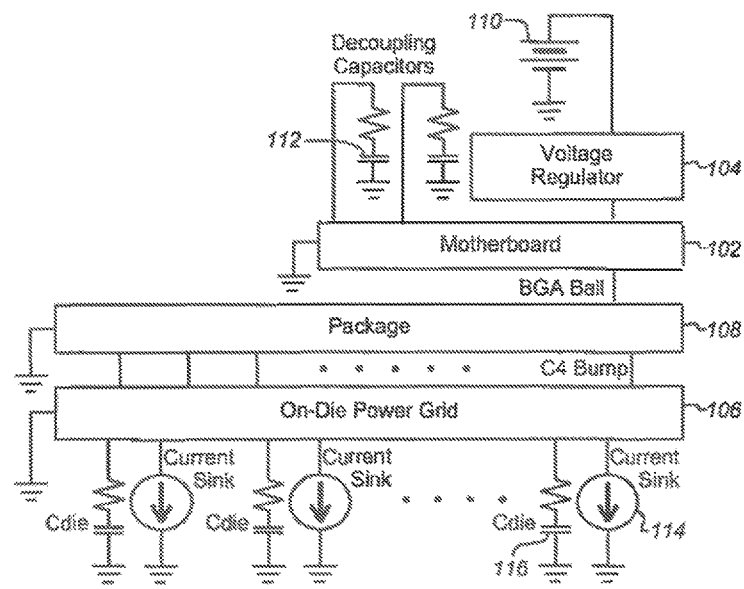
FIG. 1 is a diagram of a computing device having a motherboard and a packaged die showing electrical characteristics of the system.

The on-die power delivery network of many dies can rely heavily on MiM capacitors to stabilize the voltages and reduce noise in the die. With increasing operating frequency and decreasing die size, the MiM capacitors are designed to more difficult specifications to yield the desired level of capacitance at the desired frequency. For a given die area, the effective high frequency capacitance from an MiM capacitor is limited by design rules for via and routing spacing. At the same time the number of switching transistors increases and their size decreases with successive designs. This limits the space available for the vias that connect capacitors.

MiM capacitors have a frequency roll-off characteristic, such that the effective capacitance reduces with higher frequencies due to the series resistance effect. The frequency response of a MiM capacitor may be controlled using two factors. First is the capacitance at direct current or low frequency. Second is the 3 dB cut-off frequency, i.e. the frequency at which the capacitance is decreased by 3 dB. The amount of capacitance available at operating frequencies can be increased by increasing the number or the size of the capacitors. This increases the capacitance at direct current. The amount of available capacitance can also be increased by pushing the 3 dB cut-off frequency to higher frequencies.

Increasing the capacitance value at direct current and low frequency requires more die space and more careful routing of the vias to connect the capacitor plates to the appropriate voltages to be filtered. Increasing the 3 dB cut-off frequency may be done in a variety of different ways. One approach is to increase the number of through vias. The through via connects the MiM plates to the adjacent grid layers and this serves as a current path between the MiM and the rest of the power grid. This will decrease the equivalent resistive component of the MiM capacitor and therefore, move the 3 dB cut-off frequency to a higher frequency.

To increase the number of through vias, the overlapping area of the corresponding layers is increased so that a vertical via through the capacitor can connect to the two layers on either side of the capacitor. The overlapping area must be redesigned for each new die. The requirement for areas to overlap puts constraints on how the two connecting layers must be routed.

The high frequency characteristics of the MiM capacitors may also be improved without re-routing the corresponding layers to accommodate vias between the two layers. In addition to some number of through vias from a power supply layer to a circuitry layer, partial vias may be used. The partial vias may be implemented as blind vias, connecting only the internal layers. For example, the vias may connect a capacitor plate only to the next layer in the power grid. It also allows significant freedom in the placement of the vias because the layers between the power grid and the capacitor plates usually have little, if any, routing to interfere with a partial via.

The partial vias between the power grid and the capacitor plates decrease the equivalent resistive component of the MiM capacitor. The reduced resistive component increases the capacitance at higher frequencies, moving the 3 dB cut-off frequency to a higher frequency.

FIG. 1 is a diagram of an electronic system with a packaged die on a motherboard. The system may be any of a variety of different types and includes a motherboard, system board, or logic board 102 that is coupled to a voltage regulator 104. The voltage regulator receives power from a power supply 110 and generates the voltages required to drive the components that are connected to the motherboard. This typically includes a variety of different direct current and switched voltages. The voltage regulator typically is soldered on the motherboard but may alternatively be connected through wire lines, solder bumps, or any other way. Power is routed through the motherboard to any appropriate components of the system that rely on power from the motherboard. The motherboard includes decoupling capacitors 112 to filter the power received from the power supply and transmitted by the motherboard to appropriate components.

A die 106 is coupled to a package substrate 108 using, for example C4 (Controlled Collapse Chip Connection) bumps, although any other type of die technology may be used including direct solder attachments, wire line, and socketed systems. The package substrate 108 is in turn connected to the motherboard 102 using a ball grid array or any other suitable connection system. Power is supplied from the power supply 110 to the voltage regulator 104 to the motherboard 102 to the package 108 and from there to the die 106. While this is a common approach for supplying power to the die a variety of other power paths may be used. The die has active circuitry shown as multiple current sinks 114 and paths to parasitic capacitance shown as multiple capacitors 116.

Figures 2A, 2B:
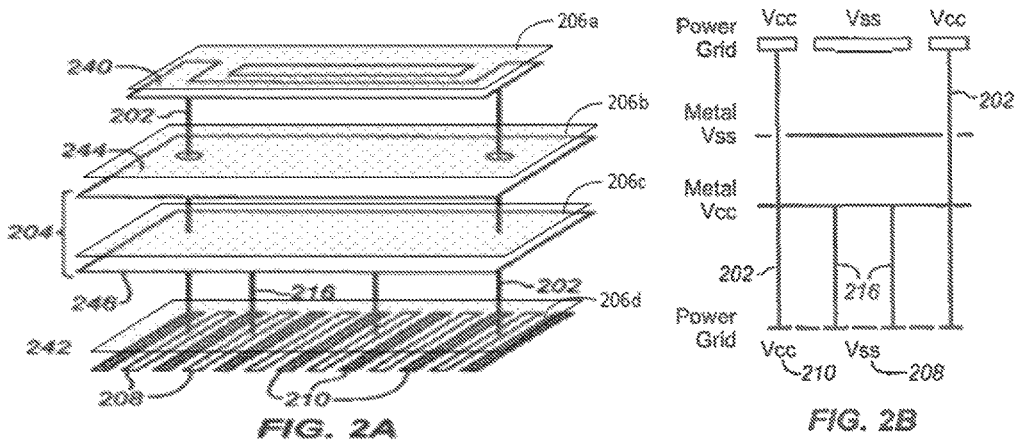
FIG. 2A is a perspective exploded diagram of a MiM capacitor according to an embodiment of the invention.
FIG. 2B is a side cross-sectional diagram of the MiM capacitor of FIG. 2A.

FIG. 2A is a diagram of a perspective exploded view of four example layers within the die 106 of FIG. 1, two power grid layers 240, 242 and two metal plate layers 244, 246. The four layers are provided as examples and may not extend all the way through the die as power grid or metal plate. The power grid layers may also include data, command and other types of routing. The metal plates may be limited to small areas of a particular area of the die. While only two metal plate layers are shown, there may be metal plates in other layers as well. Similarly, while only one power grid layer is shown on each side of the metal plates, there may be many more layers on each side. While many dies have five or ten layers on each side, there may be more or fewer. The designations and designs used for these layers may be completely different for a different die design or a different system of nomenclature.

The first or top power grid layer is an example of a metal layer surrounded by dielectric layers and used to route power at different voltages and polarities through multiple power rails. The power rails are distributed through the layer to provide power to corresponding positions in other layers. The top power grid layer may be the first layer closest to the package substrate and receives power directly from the C4 bumps, however, a different power layer may be used. The top power grid layer, as shown, supports routing layers for at least the Vcc and Vss polarities that are supplied to the die. Other polarities and voltages may also be supported on this and other layers.

A capacitor 204 is formed by two metal plates, a Vss layer 244, and a Vcc layer 246. These plates are embedded within the die and are separated by dielectric layer(s) 206a-d. The plates are shown as rectangular, however, they may be any desired shape, depending on the routing, demands for other structures and desired performance. The two plates form a capacitor by a connection above the Vss layer and below the Vcc layer. Vias connect the plates to voltages on either side of the plates as described in more detail below. In this example, this MiM capacitor is placed between Vcc and Vss rails on either side of the metal plates to filter noise and other elements out of the power supply voltage for the die.

The Vcc power rail of the top layer 240 is coupled to a full via that extends through the Vss layer, connects to a first side of the Vcc layer, continues through the other side of the Vcc layer, and connects to a structure in lower power grid layer 242 that is also at Vcc. The full via makes a connection with one plate of the capacitor but not to the other plate of the capacitor. Vcc refers to a voltage coupled to multiple CMOS (Complementary Metal Oxide Semiconductor) collectors and corresponds to the positive voltage for this die. The lower power grid layer 242 is one of several power grid layers of active CMOS circuitry and routing for the die. The lower layer is connected by the via to the upper layer through a single plate of the capacitor.

The second plate of the capacitor is coupled by a similar full via (not shown) that is connected at one end to Vss at the top power grid layer 240, connects to the first plate, the Vss plate, travels through the second plate, the Vcc plate without connecting, and connects to a different part of the lower layer 242, a part that is at Vss. Vss refers to a voltage coupled to multiple CMOS transistor sources and corresponds to the negative or ground voltage for this die. With full vias connecting Vcc to the first plate and Vss to the second plate the two plates are each provided with an opposite polarity of the power supply voltage.

The lower power grid layer is shown as having structures at Vss 208 and structures at Vcc 210. Typically there will be many more power grid layers. In some cases, the layers are labeled as M9 through M1, however the nomenclature may be different for other designs. Top fill and isolation layers may be applied over the M1 layer and a package cover may also be used to seal the package containing the die.

In addition to the full vias which attach to both the top and bottom sides of each capacitor plate, partial vias 216 are also coupled to the first capacitor plate. The partial vias extend from a Vcc section 208 of the lower routing layer 242 to the Vcc plate 246, but not beyond that plate, nor up to the opposite power grid layer 240. These vias may be placed wherever a good connection may be made to the lower layer 242, without regard for the position of the corresponding Vcc layer of the upper layer 240. In addition, depending on the design, there may or may not be many other layers between the upper Vss plate 244 and the top power grid layer 240. The full vias must be placed so as to avoid conflicting with any of these layers. The partial via does not extend from a metal plate up to the upper power grid layer and so the pathways of any layers between these two layers do not affect the placement of the partial vias 216.

FIG. 2B is a diagram of a side cross-sectional exploded view of the vias and the four layers of FIG. 2A. The same four layers are shown. The same full through vias 202 and partial vias 216 are also shown. These vias make connections with the same Vcc and Vss portions of the power grid layers and the metal plate layers. Vss partial vias (not shown) can also be applied between the lower power grid layer 242 and the Vss plate 244. In addition or instead, Vss partial vias may be inserted between the upper power grid layer 240 and the metal Vss plate for the Vss nets, as shown in FIG. 2C.

By adding these partial vias between a single one of the power grid layers and a plate of the MiM capacitor, the total number of vias connected to the MiM capacitor increases. This will decrease the equivalent resistive component of the MiM capacitor and therefore, move the 3 dB cut-off frequency to a higher frequency. The partial vias provide many advantages. The frequency range of the MiM's capacitance can be extended. The partial vias can be designed into the die at less cost and in less time than a full via. The traces on the power grid layers can be routed with priorities other than providing for MiM vias.

As the semiconductor technology changes with each project, the grid layouts change and the MiM capacitor layer routings must also change. The MiM capacitor characteristics must then be reassessed and the capacitors designed anew for each new die. The increasing switching frequency requires even higher capacitance from the MiM capacitor in the high-frequency range requiring more precision in the capacitor design.

Figure 2C:
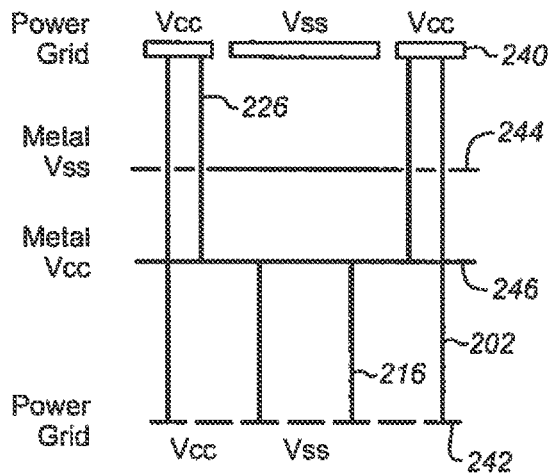
FIG. 2C is a side cross-sectional diagram of a MiM capacitor according to another embodiment of the invention.

FIG. 2C shows an example of partial and full vias for the Vcc plate in which the partial vias connect from the opposite side of the metal plate. Such partial vias may be instead of or in addition to the partial vias shown in FIG. 2B. A similar approach may be used for the Vss plate (not shown). In the example of FIG. 2C, the same four layers are shown, two power grid layers 240, 242, and two metal plate layers 244, 246. The Vcc metal plate layer 246 is connected by full vias 202 to the power grid layers on either side of the plate. The full vias connect to the Vcc plate 246 but do not connect to the Vss plate 244.

Partial vias 226 connect to Vcc power rails of the top power grid layer 240, pass through the upper Vss metal plate 244 and connect to the Vcc layer 246. The same partial vias 216 as shown in FIG. 2B also connect the lower power grid layer 242 to the Vcc layer. This allows more connections to the metal plate without requiring that the Vcc power rails be aligned. As in FIGS. 2A and 2B, no connections are shown for the Vss net, however, these may be made in the same way.

Figure 3A:
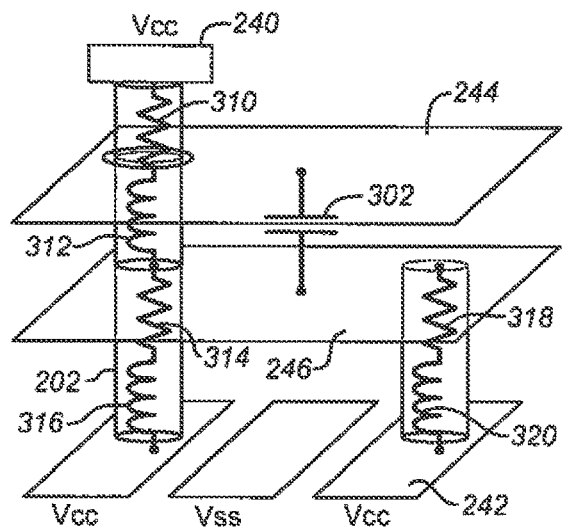
FIG. 3A is a perspective exploded diagram of the MiM capacitor of FIG. 2A showing electrical characteristics according to an embodiment of the invention.
Figure 3B:
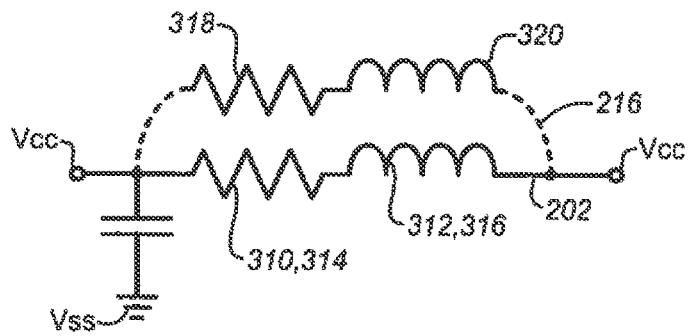
FIG. 3B is a circuit diagram of the MiM capacitor of FIG. 3A.

FIG. 3A is a diagram of a perspective view of four of the layers within the die of FIG. 1 showing electrical equivalent models of a full via and a partial via. As shown in FIG. 3A, between the Vcc plate 246 and the top power grid layer 240 the full via has a resistive component 310 and an inductive component 312. Similarly, between the Vcc plate and the lower power grid layer 242, the full via also has a resistive component 314 and an inductive component 316. These components are also shown in the circuit diagram of FIG. 3B combined together as a simple resistor and inductor. FIG. 3B is a diagram of the full and partial vias of FIG. 3A as a circuit diagram showing R (resistance) and L (inductance) components from a full and a partial via.

In the connections shown in the diagrams of FIGS. 2A, 2B, and 2C, the partial via 216 is connected parallel to the full via 202. The partial via also has a resistive component 318 and an inductive component 320 that is parallel to that of the full via. By adding partial vias, the resistive and inductive values of the on-die power delivery network (PDN) change. As shown in FIG. 3B, the additional partial vias place additional resistive and inductive components in parallel with those of the regular vias. As a result, the overall resistive and inductive values of the MiM capacitor connections are reduced. This characteristic offers better performance for the MiM capacitor at high frequency.

The cutoff frequency is inversely proportional to the RC time constant. Adding partial vias reduces the R value for the die so that the RC time constant is decreased, increasing the cutoff frequency. Also, the roll-off of the frequency response is reduced due to the transition of the dominant factor of the capacitor from capacitance to resistance. Therefore, with the reduced resistive value, the transition to resistance happens at a higher frequency.

The full via from one power grid layer on one side of a metal plate to another power grid layer on the other side of the metal plate can only be placed in places at which the routing of the same polarity power rail overlap. This allows the full vertical connection, as shown in FIG. 2A. Typically, it is very difficult to form vias that are not directly vertical. Therefore connections can only be made when a Vcc pathway in the one layer aligns vertically with a Vcc path in the other. In order to allow for more vias, the routings of the power grid layers can be changed to be better aligned and afford more through vias. Due to the constraints of the pathway and layer design rules, the spacing between the vias and the distance from a via to a metal edge is taken into account when the overlapping areas are increased. This makes it very difficult to adjust pathways for the sake of the capacitors.

To improve the high frequency characteristic of MiM capacitors without the added cost and other limits imposed by re-routing the power grid layers, partial vias can be used. The partial vias can be implemented as blind vias, connecting the internal layers. As shown in FIG. 2B, the partial vias stay between a metal plate layer and power grid layer on one side of the metal plate and do not interfere with other layers. Therefore, the partial vias do not affect routings on the power grid layer or any other layer on the opposite side.

FIG. 4A is a diagram of a partial top elevation view of the four layers of FIG. 2A in which the layers are placed side-by-side. FIG. 4A also shows the positions of possible vertical vias as described herein. Considering the top power grid layer 402, there are Vcc traces 404 and Vss traces 406. Full vias are shown as a separate top view 414 as if they formed a layer. Instead the vias 414 are vertical and are shown as elevation or cross-section at any point in the structure. The view would be the same. There are two Vcc traces 404 on the top layer 402 so that there may be two rows of Vcc vias on the via layer 414. Such a via must have a corresponding connecting point to the routings on the lower power grid layer 412. As shown in this example, the top power grid layer 402 has horizontal Vcc routes 404 and the lower power grid layer 412 has horizontal routes 208. A full via may be positioned where these two routes cross. These vias are shown as the dots 422 of the via layer 414.

While these Vcc vias connect to the Vcc plate 410 of the capacitor, they extend through holes in the Vss plate 408 of the capacitor. The holes in the Vss plate are also shown. Similarly FIG. 4A shows Vss vias 424 in the via layer 414 that extend between Vss routing 210 in the lower power grid layer 412 and through holes in the Vcc plate 410 to connect to the Vss plate 408 and then extend further up to the Vss routing 406 in the top power grid layer 402.

Vcc partial vias may be added in many more locations. Since the Vcc plate 410 of the MiM covers almost the entire available area, additional partial vias may be added anywhere along the Vcc vertical routing lines 208 of the lower power grid layer 412. The white-dashed boxes 428 show examples of placement for partial vias 426 on the via layer 414. As shown the number of vias may be increased by 50% or more. The partial vias connect the lower power grid layer and Vcc metal plate layer, and do not have any connection with the top power grid layer 402 as explained above. This can increase the frequency of the 3 dB capacitance cutoff by 25% or more, depending on the other parameters of the layers and of the capacitor.

As shown by the via layer 414, dense placement of partial vias can be used to accommodate dense routings on the power grid layers. This overcomes the limitations of the design rules, which specify minimum trace width and spacing. The partial vias can be added with no impact on trace width or spacing, and can provide the same high-frequency MiM performance improvements that are provided by full vias.

Figure 4B:
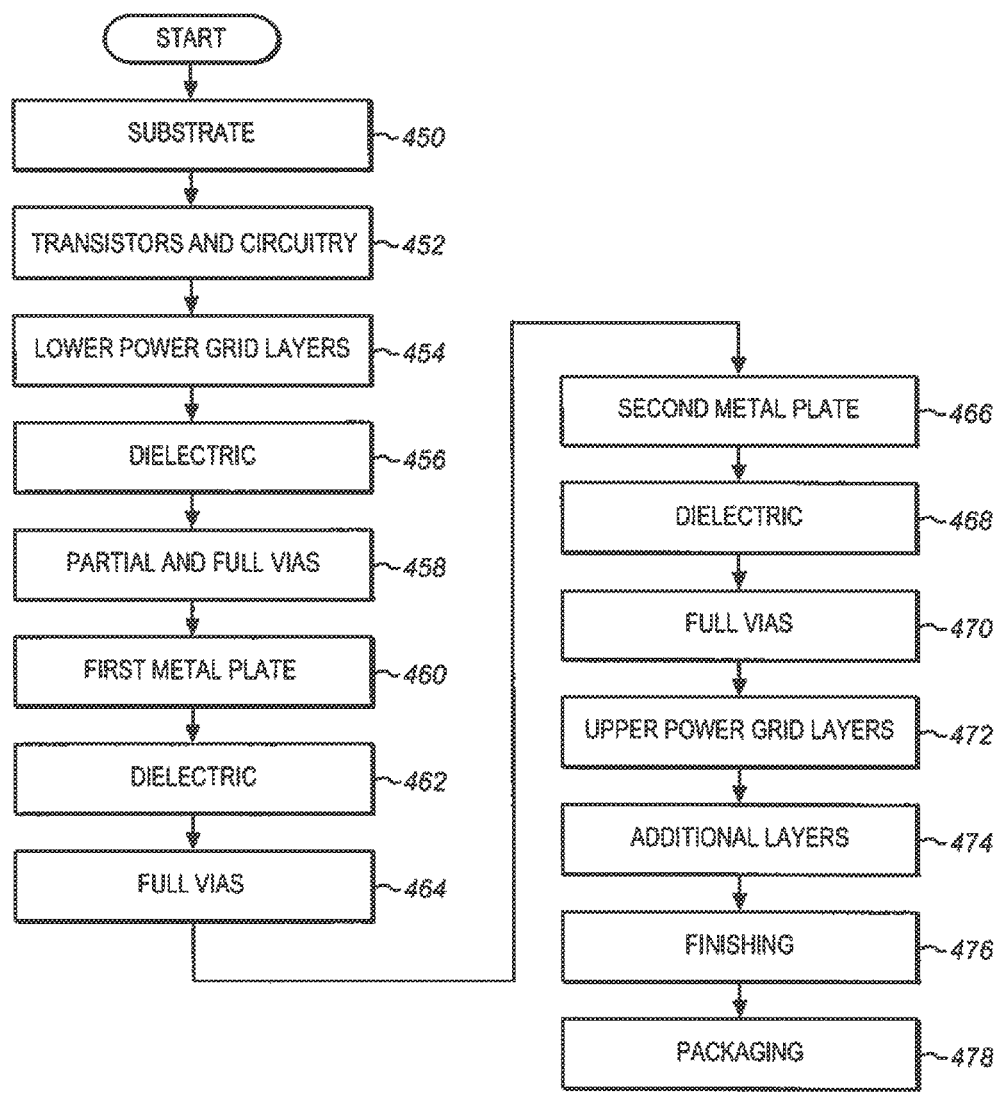
FIG. 4B is a process flow diagram of forming a MiM capacitor according to an embodiment of the invention.

FIG. 4B is a process flow diagram of forming a die with a capacitor structure as described above. The process begins at 450 with a substrate or build-up layer. This layer may be removed later, depending on the particular implementation. After some initial layers, the electronic transistor circuitry is formed on the die at 452. There may be many circuit routing layers or one. In addition, there may be semiconductor components such as CMOS transistors and other components formed within and adjacent to these routing layers. The particular types of operations used to form the circuitry and associated routing layers on the substrate of the die may be determined based on the type of die and its intended use. These layers may include additional routing layers, insulating, protecting and cover layers. At 454, one or more power grid layers with power rails are formed. The power rails have at least a first and second polarity and perhaps more, depending on the particular implementation. There may also be a variety of different voltages. Multiple such layers may be formed using photolithography, deposition, metal printing and other techniques as with the transistor layers.

At 456, a dielectric layer is formed to isolate the power rails. The dielectric may be formed using any of a variety of different deposition techniques. At 458 the partial and full vias are formed by drilling, etching, boring or any other technique to reveal paths between the top of the dielectric layer through to the respective power rails of the lower power grid layer. The vias may then be plated or filled with copper or another conductive material to establish an electrical connection with the power rails.

At 460, a first metal plate in a first metal layer of the die is formed over the vias, the dielectric, and the power grid layer. The metal plate will form an electrical connection with the vias and establish a connection for the partial vias. While this metal plate is referred to as the first metal plate, this refers to its position for the capacitor structure. There may be other metal plates formed for other purposes at various different layers of the die. The particular shape, thickness and other parameters of the plate may be determined based on the desired capacitance.

At 462 another dielectric layer is formed over the first metal plate and at 464 the full vias are extended from the first metal plate to the top of the dielectric. These will also be filled or plated so that they are conductive between the first metal plate and the second metal plate which will be formed over the dielectric.

At 466, a second metal plate is formed in a second metal layer of the die over the dielectric layer. The second metal plate is second in that it forms the other plate of the capacitor opposite the dielectric layer formed at 462. In the case of the full vias for the first metal plate, this plate may be formed with holes that are then filled with dielectric to isolate the vias from the plate as shown e.g. in FIG. 2A. For vias that are to connect to the second plate and not the first plate, through holes will be formed in the first metal plate.

At 468, another dielectric layer is formed over the second metal plate to isolate the capacitor from any other components of the die. At 470, the full vias are completed to make the connections between the lower power grid layer, one of the metal plate layers and the upper power grid layers formed at 472. The full vias are filled to connect routing on the first or another one of the power grid layers to the appropriate metal plate as above.

At 472 the upper power grid layers are formed over the dielectric making connections with the full vias, any partial vias, and making any data connection vias that are to be connected to the external connections with the package substrate. There may be one or many upper power grid layers, depending on the particular die.

As an alternative to forming the vias after each layer is formed, it may be possible to form a plurality of full vias by drilling vias through all of the intermediate layers including both metal plates to a power rail of the first polarity of the lower power grid layer. The particular technique for forming the vias may be modified to suit different types of dies and different fabrication techniques.

While the full vias extend through both metal plates, the partial vias extend from one of the power grid layers connecting at a power rail of the first polarity and ending at the corresponding one of the metal plates without electrically connecting to the other power grid layer.

At 474, additional layers not important to the described embodiments may be added to the die and at 476, the die is then finished. The particular types of operations used to finish the die may be determined based on the type of die and its intended use. In this example, additional layers are formed on the die. These may include additional routing layers, insulating, protecting and cover layers. At 478, the die is packaged for installation in an electronic device. The completed die shows denser routing layers and higher frequency capacitance as described herein.

Figure 5:
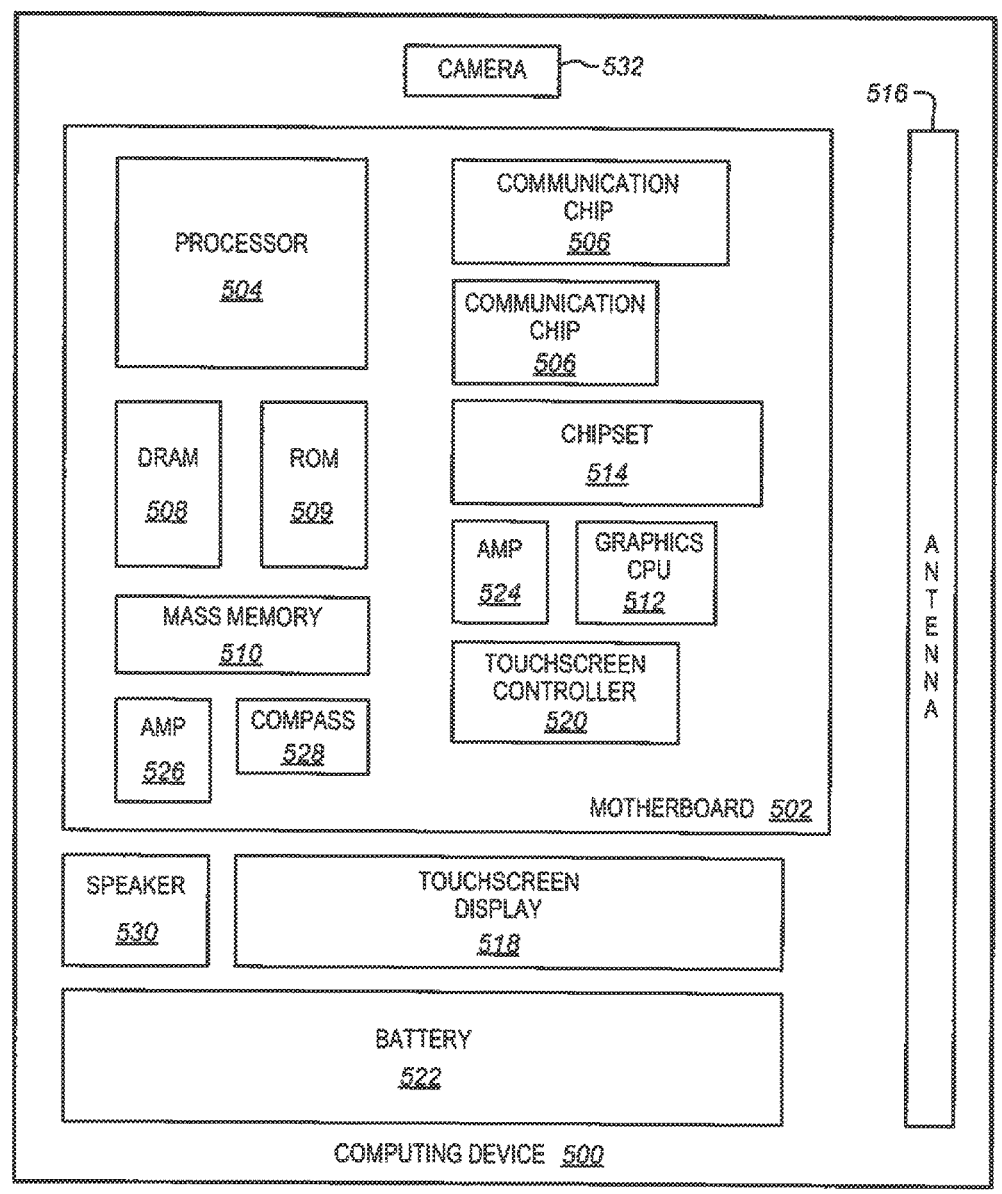
FIG. 5 is a block diagram of a computing device incorporating a Metal-insulator-Metal capacitor structure according to an embodiment of the invention

FIG. 5 illustrates a computing device 500 in accordance with one implementation of the invention. The computing device 500 houses a board 502, such as the motherboard 102 of FIG. 1. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged using MiM capacitors connected using full and partial vias, if desired. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a semiconductor die having a first power grid layer with power rails of a first and a second polarity and a second power grid layer having power rails of the first and the second polarity. A capacitor structure includes a first metal plate in a first metal layer of the die between the power grid layers, a second metal plate in a second metal layer of the die between the first metal plate and the second power grid layer, a dielectric between the first metal plate and the first power grid layer, a dielectric between the second metal plate and the second power grid layer, a plurality of full vias extending from a power rail of the first polarity of the first power grid layer to a first side of the second metal plate and from a second side of the second metal plate opposite the first side of the metal plate to a power rail of the first polarity of the second power grid layer, and a plurality of partial vias extending from the power rail of the first polarity of the second power grid layer and ending at the second side of the second metal plate.

In further embodiments, each of the plurality of full vias extend through the first metal plate without electrically connecting to the first metal plate. Further embodiments include a dielectric layer between the first and the second metal plates to form a metal-insulator-metal in die capacitor. In further embodiments, each of the plurality of partial vias amr blind vias. In further embodiments, the first polarity is Vcc. In further embodiments, the second power grid layer is coupled to CMOS (Complementary Metal Oxide Semiconductor) circuitry and the second polarity is Vss.

Further embodiments include a second plurality of full vias extending from a power rail of the second polarity of the first power grid layer to a first side of the first metal plate and from a second side of the first metal plate opposite the first side of the first metal plate to the first power grid layer.

Further embodiments include a second plurality of partial vias extending from routings of the second polarity of the first power grid layer and ending at the first metal plate.

Some embodiments pertain to an apparatus that includes a first power grid layer formed in a semiconductor die, the first power grid layer having power rails of a first and a second polarity, a second power grid layer formed in the semiconductor die, the second power grid layer having power rails of the first and the second polarity, a first metal plate in a first metal layer of the die between the power grid layers, a second metal plate in a second metal layer of the die between the first metal plate and the second power grid layer, a dielectric between the first metal plate and the first power grid layer, a dielectric between the second metal plate and the second power grid layer, a plurality of full vias extending from a power rail of the first polarity of the first power grid layer to a first side of the second metal plate and from a second side of the second metal plate opposite the first side of the metal plate to a power rail of the first polarity of the second power grid layer, and a plurality of partial vias extending from the power rail of the first polarity of the second power grid layer and ending at the second side of the second metal plate.

Further embodiments include a dielectric layer between the first and the second metal plates to form a metal-insulator-metal in die capacitor. In further embodiments, the first polarity is Vcc. Further embodiments include a layer of CMOS (Complementary Metal Oxide Semiconductor) circuitry coupled to the second power grid layer and wherein the second polarity is Vss. Further embodiments include a package substrate coupled to the first power grid layer through a plurality of solder balls. Further embodiments include a second plurality of partial vias extending from the power rail of the second polarity of the first power grid layer and ending at the first side of the first metal plate. Further embodiments include a second plurality of partial vias extending from the power rail of the first polarity of the first power grid layer and ending at the first side of the second metal plate.

In some embodiments a method of forming a capacitor structure in a semiconductor includes forming a first power grid layer with power rails of a first and second polarity, forming a dielectric over the first power grid layer, forming a first plurality of conductive vias through the dielectric to the first power grid layer, forming a first metal plate in a first metal layer of the die over the dielectric and connecting to the conductive vias, forming a second dielectric layer over the first metal plate, forming a second plurality of conductive vias through the second dielectric to connect to a portion of the first plurality of conductive vias, forming a second metal plate in a second metal layer of the die over the dielectric layer and connecting to the conductive vias of the second plurality, forming a third dielectric layer over the second metal plate, forming a second power grid layer over second dielectric layer, and connecting the conductive vias of the second plurality to the second grid layer.

In further embodiments, forming vias of the second plurality comprises forming vias extending from the first power grid layer to a first side of the first metal plate and from a second side of the first metal plate opposite the first side of the metal plate to a the second power grid layer without electrically connecting with the second metal plate.

In further embodiments, forming the first plurality of vias comprises forming vias to connect to the first power grid layer and the first metal plate, and a portion of the first plurality of vias end at the first metal plate without electrically connecting to the second power grid layer.

In further embodiments, forming a first plurality of conductive vias comprises drilling vias through the dielectric to power rails of the first power grid layer. In further embodiments, forming a first plurality of conductive vias comprises plating the vies after drilling.

The invention claimed is:

1. A semiconductor die having a first power grid layer with power rails of a first and a second polarity and a second power grid layer having power rails of the first and the second polarity, and a capacitor structure, the capacitor structure comprising:
    a first metal plate in a first metal layer of the die between the power grid layers;
    a second metal plate in a second metal layer of the die between the first metal plate and the second power grid layer;
    a first dielectric between the first metal plate and the first power grid layer;
    a second dielectric between the second metal plate and the second power grid layer;
    a plurality of full vias extending from a power rail of the first polarity of the first power grid layer to a first side of the second metal plate and from a second side of the second metal plate opposite the first side of the metal plate to a plurality of routing lines of the first polarity of the second power grid layer; and
    a plurality of partial vias extending from the plurality of routing lines of the first polarity of the second power grid layer and ending at the second side of the second metal plate, wherein the plurality of partial vias have a resistive component and an inductive component parallel to the plurality of full vias which are combined to increase an overall cut-off frequency of the capacitor structure.

2. The semiconductor die of claim 1, wherein each of the plurality of full vias extend through the first metal plate without electrically connecting to the first metal plate.

3. The semiconductor die of claim 1, further comprising a third dielectric layer between the first and the second metal plates to form a metal-insulator-metal in die capacitor.

4. The semiconductor die of claim 1, wherein each of the plurality of partial vias are blind vias.

5. The semiconductor die of claim 1, wherein the first polarity is that of Vcc.

6. The semiconductor die of claim 5, wherein the second power grid layer is coupled to CMOS (Complementary Metal Oxide Semiconductor) circuitry and the second polarity is that of Vss.

7. The semiconductor die of claim 1, further comprising a second plurality of full vias extending from a power rail of the second polarity of the first power grid layer to a first side of the first metal plate and from a second side of the first metal plate opposite the first side of the first metal plate to the first power grid layer.

8. The semiconductor die of claim 1, further comprising a second plurality of partial vias extending from routings of the second polarity of the first power grid layer and ending at the first metal plate.

9. An apparatus comprising:
    a first power grid layer formed in a semiconductor die, the first power grid layer having power rails of a first and a second polarity;
    a second power grid layer formed in the semiconductor die, the second power grid layer having power rails of the first and the second polarity;
    a first metal plate in a first metal layer of the die between the power grid layers;
    a second metal plate in a second metal layer of the die between the first metal plate and the second power grid layer;
    a first dielectric between the first metal plate and the first power grid layer; a second dielectric between the second metal plate and the second power grid layer;
    a plurality of full vias extending from a power rail of the first polarity of the first power grid layer to a first side of the second metal plate and from a second side of the second metal plate opposite the first side of the metal plate to a plurality of routing lines of the first polarity of the second power grid layer; and a plurality of partial vias extending from the plurality of routing lines of the first polarity of the second power grid layer and ending at the second side of the second metal plate, wherein the plurality of partial vias have a resistive component and an inductive component parallel to the plurality of full vias which are combined to increase an overall cut-off frequency of the capacitor structure;

active circuitry having a current sinks and coupled to the first and second metal plate to receive power for the plurality of current sinks; and a package substrate coupled to the die having a connection system to receive power from a motherboard and to couple the power to the first and second power grid layer.

10. The apparatus of claim 9, further comprising a third dielectric layer between the first and the second metal plates to form a metal-insulator-metal in die capacitor.

11. The apparatus of claim 9, wherein the first polarity is that of Vcc.

12. The apparatus of claim 11, wherein further comprising a layer of CMOS (Complementary Metal Oxide Semiconductor) circuitry coupled to the second power grid layer and wherein the second polarity is that of Vss.

13. The apparatus of claim 12, further comprising a package substrate coupled to the first power grid layer through a plurality of solder balls.

14. The apparatus of claim 12, further comprising a second plurality of partial vias extending from the power rail of the second polarity of the first power grid layer and ending at the first side of the first metal plate.

15. The apparatus of claim 9, further comprising a second plurality of partial vias extending from the power rail of the first polarity of the first power grid layer and ending at the first side of the second metal plate.

16. A method of forming a capacitor structure in a semiconductor, the method comprising:

forming a first power grid layer with power rails of a first and second polarity;

forming a dielectric over the first power grid layer;
forming a first plurality of conductive vias through the dielectric to the first power grid layer;
forming a first metal plate in a first metal layer of the die over the dielectric and connecting to the conductive vias; forming a second dielectric layer over the first metal plate;
forming a second plurality of conductive vias through the second dielectric to connect to a portion of the first plurality of conductive vias; forming a second metal plate in a second metal layer of the die over the dielectric layer and connecting to the conductive vias of the second plurality;
forming a third dielectric layer over the second metal plate;
forming a second power grid layer over second dielectric layer; and
connecting the second plurality of conductive vias to the second grid layer, wherein the second plurality of conductive vias have a resistive component and an inductive component parallel to the first plurality of conductive vias which are combined to increase an overall cut-off frequency of the capacitor structure, and wherein the first and second plurality of conductive vias connect to a plurality of routing lines of the first polarity of the second power grid layer.

17. The method of claim 16, wherein forming vias of the second plurality comprises forming vias extending from the first power grid layer to a first side of the first metal plate and from a second side of the first metal plate opposite the first side of the metal plate to a the second power grid layer without electrically connecting with the second metal plate.

18. The method of claim 16, wherein forming the first plurality of vias comprises forming vias to connect to the first power grid layer and the first metal plate, wherein a portion of the first plurality of vias end at the first metal plate without electrically connecting to the second power grid layer.

19. The method of claim 16, wherein forming a first plurality of conductive vias comprises drilling vias through the dielectric to power rails of the first power grid layer.

20. The method of claim 19, wherein forming a first plurality of conductive vias comprises plating the vias after drilling.

* * * * *